United States Patent [19]

Bergmans

[11] Patent Number: 5,426,671
[45] Date of Patent: Jun. 20, 1995

[54] TRANSMISSION SYSTEM COMPRISING RECEIVER WITH IMPROVED TIMING MEANS

[75] Inventor: Johannes W. M. Bergmans, Eindhoven, Netherlands

[73] Assignee: U.S. Philips Corporation, New York, N.Y.

[21] Appl. No.: 18,991

[22] Filed: Feb. 18, 1993

[30] Foreign Application Priority Data

Feb. 24, 1992 [EP] European Pat. Off. ............ 92200530

[51] Int. Cl.⁶ ............................................. H04L 7/00
[52] U.S. Cl. .................................... 375/354; 327/261
[58] Field of Search ..................... 375/81, 83, 94, 85, 375/84, 106, 13; 329/304; 328/133, 63; 307/262, 590, 352

[56] References Cited

U.S. PATENT DOCUMENTS

| | | | |
|---|---|---|---|
| 4,528,512 | 7/1985 | Yoshida | 375/81 |
| 4,866,739 | 9/1989 | Aoazzi et al. | 375/106 |
| 5,259,005 | 11/1993 | LeRosa et al. | 375/106 |

OTHER PUBLICATIONS

"Q. P., An Improved Code for High Density Digital Recording", by Bixby et al, IEEE, vol. MAG 15, No. 6, Nov. 1989, pp. 1465–1467.

"Timing Recovery in Digital Synchronous Data Receivers", by K. Mueller et al, IEEE, vol. COM-24, No. 5, May, 1976, pp. 516–531.

"Two New Equalisation Schemes for High-Density Digital Magnetic Recording Systems with Quad-Phase Modulation Code", Electronics Letters, Jan. 4, 1990, vol. 26, No. 1, pp. 13–15.

"Concise Papers", by R. Wood, IEEE Transactions on Communications, vol. COM-31, No. 1, Jan. 1983, pp. 105–110.

"Dual Digital Transmission System for Multipair Cables Based on 'Crank-Shaft Coding'", Electronics Letters Jul, 19, 1984, vol. 20, No. 15, pp. 619–621.

*Primary Examiner*—Stephen Chin
*Assistant Examiner*—Tesfaldet Bocure
*Attorney, Agent, or Firm*—Leroy Eason

[57] ABSTRACT

A data transmission system wherein the data symbols to be transmitted are divided into two groups, for example odd and even, and each data symbol in one group is represented by a signal element which differs from the signal element used to represent each data symbol in the other group. An example of such encoding is the quadra-phase code. The transmitted signal is a summation of the signal elements of both groups. At the receiver the received signal is sampled at a first and a second sampling instant for every two successive signal elements, and from the sample values decisions are made as to the symbol values represented thereby. This requires that the sampling instants accurately correspond to the two groups of signal elements. To achieve such timing control the receiver includes a phase detector for deriving an error signal representing deviation between actual and correct sampling instants, and the actual sampling instants are adapted to minimize the error signal. The error signal is based on a correlation between the values of samples at the sampling instants and expected values thereof at such instants.

8 Claims, 4 Drawing Sheets

TRANSMISSION SYSTEM COMPRISING RECEIVER WITH IMPROVED TIMING MEANS

BACKGROUND OF THE INVENTION

The invention relates to a transmission system comprising a transmitter and a receiver, the transmitter comprising first coding means for coding a first series of data symbols into a first series of signal elements and second coding means for coding a second series of data symbols into a second series of signal elements, the relation between the first series of data symbols and the first series of signal elements being different from the relation between the second series of data symbols and the second series of signal elements. The transmitter also comprises means for combining the two series of signal elements into a series of data pulses, and the transmission system comprises a channel for transmitting the data pulses to a receiver. At the input of the receiver a received signal will thereby consist of the first series of signal elements which has a first reference value at a first series of reference instants and the second series of signal elements which have a second reference value at a second series of reference instants. The receiver comprises sampling means for deriving a first or second sample value respectively, of the received signal at a first or second series of sampling instants respectively, and timing means for deriving the sampling instants from the data pulses. The invention likewise relates to such a receiver.

A transmission system as defined in the opening paragraph is known from the journal article "Q.P., An improved code for high density digital recording" by J. A. Bixby and R. A. Ketcham in IEEE Transactions on Magnetics, Vol. MAG-15, No. 6, November 1979. Transmission systems of this type may be used, for example, for data signal transmission via a transmission medium, for example, a cable link or radio link, or for reconstructing data signals which come from a magnetic tape or disc.

When data symbols are transmitted via a transmission medium or stored on a recording medium respectively, the symbols to be transmitted or recorded respectively, are coded by coding means into data pulses to be supplied to the transmission medium or recording medium, referred to as a "channel" hereinafter.

The form of the data pulses largely determines the properties of the signal transmitted through the channel. An important measure of the signal to be transmitted is the frequency spectrum which for many applications must meet various requirements.

A first desired property of the frequency spectrum is that the overall bandwidth of the signal remains limited because the cost of the necessary equipment rises according as the bandwidth of the signals to be processed is larger, for virtually all transmission mediums and recording mediums. A second desired property is that the DC component of the frequency spectrum should be zero. This property is important for channels which are incapable of passing DC components, which is the case in a number of frequently used channels. Examples of such channels are the public telephone network having a passband of 300 Hz to 3400 Hz, and magnetic recording channel for which the reading of magnetically stored information is based on the detection of flux changes in a reading head.

A method used for limiting the bandwidth of the signal is to split up a data stream to be transmitted or recorded into different groups of data symbols and generating data pulses which are each a sum of different signal elements, each signal element representing one of the symbols of the group of data symbols. Since a plurality of symbols are transmitted simultaneously, the duration of the signal elements may be shorter than when all data symbols are to be transmitted consecutively. As a result of this shorter duration of the signal elements the bandwidth of the data pulses may be smaller. However, the signal elements do have to be suitably selected to avoid mutual disturbance, so as to make it possible for the group of data symbols to be reconstructed from a received data pulse.

In the system known from above journal article signal elements are used which have a duration equal to twice the symbol interval T are used. The signal elements of the first coding means, depending on the binary value of the associated data symbol, adopt the values $1,0,-1,0$ and $-1,0,1,0$ respectively, for a period of time $2 \cdot T$. Depending on the binary value of the associated data symbol, the signal elements of the second coding means adopt the respective values $1,0,-1,0$ and $-1,0,1,0$ for a period of time $2 \cdot T$. The code leading to these signal elements is also known as Quadra-Phase code. However, that is not the only known code which consists of a sum of simultaneously transmitted signal elements.

The received signal is ideally sampled at sampling instants which coincide with reference instants at which one of the signal elements has an associated reference value. In the case of the Quadra-Phase code this reference value for both reference elements is equal to zero. In this manner sample values are obtained which according to the Quadra-Phase code only depend on the other signal element. These samples may then be used for the decision about the value of the associated data symbols.

If the sampling instants deviate from the reference instants, the obtained sample values will not only depend on a single signal element, but also on one (or more) other signal element(s), which will reduce the reliability of the decision made about the value of the associated data symbols.

In order to avoid this deviation, the prior-an system comprises means for deriving the sampling instants from the data pulses. As a result of the relatively small bandwidth of such codes, clock signal recovery for deriving the sampling instants from the received data symbols is rather difficult.

In the prior-art system a clock signal is derived from the received data pulses with the aid of a non-linear element having a fourth-power transfer chracteristic. A problem with such non-linear clock recovery systems is that the signal-to-noise ratio of the non-linearly processed input signal is always smaller than that of the input signal. Since noise in a clock signal manifests itself in the form of phase jitter, the recovered clock signal will contain rather much phase jitter when the input signal has a relatively low signal-to-noise ratio. The phase jitter results in the fact that the sampling instants are not always optimal.

The operation of the prior-art clock recovery system can be improved by including a narrow band phase-locked loop subsequent to the non-linear element, so that the signal-to-noise ratio of the clock signal may be improved. However, as a result of the small bandwidth of the phase-locked loop, the tracking rate of the clock recovery system will be relatively slow. If the transmission rate strongly fluctuates, such as, for example, on the magnetic recording channel or in a radio link between a fixed and a mobile station, it may happen that the narrow band phase-locked loop is incapable of keeping up with these fluctuations and so synchronization is lost.

SUMMARY OF THE INVENTION

It is an object of the invention to provide a system as defined in the opening paragraph in which the clock recovery system produces a clock signal having reduced phase jitter without the tracking rate of the clock recovery system being detrimentally affected.

For this purpose the invention is characterized, in that the timing means comprise means for determining a timing error signal which depends on the correlation between a second sample value and an expected first sample value, the timing means further including adjusting means for adjusting the sampling instants in response to the timing error signal.

As a result of these characteristic features a control loop is created which minimizes the timing error signal, which is a measure of the difference between the sampling instants and the reference instants. Hereinbelow it will be explained why the timing error signal is really a measure of the difference between the sampling instants and the reference instants. The input signal of the receiver is assumed to be the same as the Quadra-Phase signal transmitted by the transmitter. Generally, however, the transmitted Quadra-Phase signal will be a square-wave signal, but as a result of the filtering effected in the channel and equalizing means, if any, the signal at the input of the receiver is an analog signal which is capable of adopting with time any value in a specific interval.

At a specific instant t $(2iT \leq t < 2iT+2T)$ the following holds for the first and second signal elements $s_1$, $s_2$ and the resulting quadra-Phase input pulse $s_c$ of the receiver:

$$s_1(t) = a_{2i-1} \cdot \cos\left(\pi \frac{t}{T}\right) \quad (1)$$

$$s_2(t) = a_{2i} \cdot \sin\left(\pi \frac{t}{T}\right)$$

$$s_c(t) = a_{2i-1} \cdot \cos\left(\pi \frac{t}{T}\right) + a_{2i} \cdot \sin\left(\pi \frac{t}{T}\right)$$

Herein $a_{2i-1}$, and $a_{2i}$ are two successive data symbols from a sequence of data symbols, t is time and T is the mean time period between successive data symbols. It is assumed that Kth data symbol $a_k$ in the sequence can adopt any of the values $-(M-1)$, $-(M-3)$, ..., $-1$, $+1$, ..., $+(M-3)$, $+(M-1)$ if the number M of possible symbol values is even. If the number M of symbol values is odd, $a_k$ is assumable to adopt any of the values $-(M-1)$, $-(M-3)$, ..., $-2$, 0, 2, ..., $(M-3)$, $(M+1)$. Zeros of the first and second signal elements $s_1$, $s_2$ which zeros can be used as reference instants for clock recovery, are situated at $t=2iT+T/2$ and $t=2iT+T$ respectively. If it is assumed that the first sampling instant is near zero of the first signal element and so is equal to $2iT+T/2+\tau$, and the second sampling instant is near a zero of the second signal element and so is equal to $2iT+T+\tau$, where $\tau$ is the deviation between the zero reference instants and the sampling instants, the first and second sample values may be written as:

$$s_c\left(2iT + \frac{T}{2} + \tau\right) = a_{2i-1} \cdot \cos\left(\frac{\pi}{2} + \pi \frac{\tau}{T}\right) + a_{2i} \cdot \sin\left(\frac{\pi}{2} + \pi \frac{\tau}{T}\right) \quad (2)$$

$$= -a_{2i-1} \cdot \sin\left(\pi \frac{\tau}{T}\right) + a_{2i} \cdot \cos\left(\pi \frac{\tau}{T}\right)$$

$$s_c(2iT + T + \tau) = a_{2i-1} \cdot \cos\left(\pi + \pi \frac{\tau}{T}\right) + a_{2i} \cdot \sin\left(\pi + \pi \frac{\tau}{T}\right) \quad (3)$$

$$= -a_{2i-1} \cdot \cos\left(\pi \frac{\tau}{T}\right) - a_{2i} \cdot \sin\left(\pi \frac{\tau}{T}\right)$$

The expected value of the first sample assuming $\tau$ is small, is therefore the value of the data symbol $a_{2i}$. Since there is only a decision $\hat{a}_{2i}$ about the value of $a_{2i}$ available in the receiver, this decision is used in lieu of the real value of $\hat{a}_{2i}$. For simplicity there is assumed in the following derivations that $\hat{a}_k$ equals $a_k$. If the correlation between two signals is assumed to be determined by means of a multiplication, the timing error signal may be written as: $V_\tau = a_{2i} \cdot s_c(2iT+T/2+\tau)$. The expectation value $E\{e_i\}$ thereof may then be written as:

$$E\{V_\tau\} = E\left\{-a_{2i-1} \cdot a_{2i} \cdot \cos\left(\pi \frac{\tau}{T}\right)\right\} + \quad (4)$$

$$E\left\{-a_{2i}^2 \cdot \sin\left(\pi \frac{\tau}{T}\right)\right\}$$

If $a_{2i-1}$ and $a_{2i}$ are assumed to be uncorrelated, $E\{a_{2i-1} \cdot a_{2i}\}$ equals zero. For the expectation value of the timing error signal the following then holds:

$$E\{V_\tau\} = E\{-a_{2i}^2\} \cdot \sin\left(\pi \frac{\tau}{T}\right) \quad (5)$$

From (5) it appears that indeed a timing error signal is obtained which can be used for adjusting sampling instants in the proper direction.

Similarly, the signal $a_{2i-1} \cdot s_c(T+\tau)$ can be shown to have an expectation value different only with respect to its sign from the expectation value of $a_{2i} \cdot s_c(T/2+\tau)$, so that also the signal $a_{2i-1} \cdot s_c(T+\tau)$ may be used for adjusting the sampling instants.

If $\tau$ has such a small value that the decision about the symbol $a_{2i}$ remains correct, the timing error signal $e_1$ will have the correct value, so that the sampling instants are adjusted in the proper direction. Simulations have shown that for larger values of $\tau(|\tau|<T))$ the expectation value of $a_{2i-1} \cdot s_c(T+\tau)$ no longer adopts a value that may lead to synchronization at the wrong sampling instants. This property renders the use of a word synchronization mechanism in a transmission system according to the invention redundant.

It should be observed that in the journal article "Timing Recovery in Digital Synchronous Data Receivers" by K. H. Mueller and M. Müller, IEEE Transactions on Communications, COM 24, May 1976, pp. 516–536, a timing error signal is described which is a measure of the difference between ideal and actual sample or decision instants, which timing error signal shows some similarity with the timing error signal according to the invention. However, the above journal article refers to clock recovery systems in receivers for consecutive data pulses, in which no more than one signal element is used, so that this journal article does not provide an indication as to how to handle a system in which two or more different signal elements are used which are simultaneously present.

A further embodiment of the invention is characterized, in that the timing error signal depends on the correlation between the expected first sample value and the difference between the second sample value and the expected second sample value.

These characteristic features provide that a timing error signal is obtained whose expectation value in binary transmission is substantially equal to the actual value. This is advantageous in that an estimation of the expectation value can be made much more rapidly as a result of which the clock recovery circuit is capable of locking on much more rapidly, or capable of keeping up with faster fluctuations in the transmission rate respectively. If the timing error signal according to this embodiment is selected to be equal to $a_{2i} \cdot \{s_2(t) - a_{2i-1}\}$, from (1) it follows for the actual value of $e_1$:

$$V_\tau = a_{2i} \cdot \left( a_{2i-1} - a_{2i-1} \cdot \cos\left(\pi \frac{\tau}{T}\right) - a_{2i} \cdot \sin\left(\pi \frac{\tau}{T}\right) \right) \quad (6)$$

$$= 2a_{2i-1} \cdot a_{2i} \cdot \sin^2\left(\pi \frac{\tau}{2T}\right) - a_{2i}^2 \cdot \sin\left(\pi \frac{\tau}{T}\right)$$

The term depending on $a_{2i-1}$ is now, certainly for smaller $\tau$, about equal to zero.

A preferred embodiment of the invention is characterized in that the timing error signal depends on the difference between the correlation of the second sample value with the expected first sample value and the correlation of the first sample value with the expected second sample value.

This timing error signal has the property that the expectation value is equal to the actual value in binary transmission. If the timing error signal according to this embodiment is selected to be equal to $a_{2i} \cdot s_c(2iT+T/2+\tau) - a_{2i-1} \cdot s_c(2iT-T-\tau)$, it follows from (1) for the actual value $$V_\tau = a_{2i} \cdot \left( -a_{2i-1} \cdot \cos\left(\pi \frac{\tau}{T}\right) - a_{2i} \cdot \sin\left(\pi \frac{\tau}{t}\right) \right) + \quad (7)$$

$$a_{2i-1} \cdot \left( -a_{2i-1} \cdot \sin\left(\pi \frac{\tau}{T}\right) + a_{2i} \cdot \cos\left(\pi \frac{\tau}{T}\right) \right) =$$

$$-\sin\left(\pi \frac{\tau}{T}\right) \cdot (a_{2i-1}^2 + a_{2i}^2)$$

A further embodiment of the invention is characterized in that the receiver comprises adjusting means for adjusting the difference between the first sampling instants and the second sampling instants in response to a difference signal proportional to the difference between (1) the sum of the correlation of the second sample value with the expected first sample value and the correlation of the first sample value with the expected second sample value, and (2) of a value proportional to the correlation of the expected first sample value with the expected second sample value.

These characteristic features enable correction for a deviation from the difference between the first and second sampling instants. Deviations like these may be, for example, the result of tolerances of clock generator components or deviations from the ideal forms of the signal elements.

BRIEF DESCRIPTION OF THE DRAWINGS

The invention will now be further explained with reference to the drawing FIGURES in which like elements are denoted by like reference characters, in which:

FIG. 4 is used;

DESCRIPTION OF THE PREFERRED EMBODIMENTS

Figure 1:
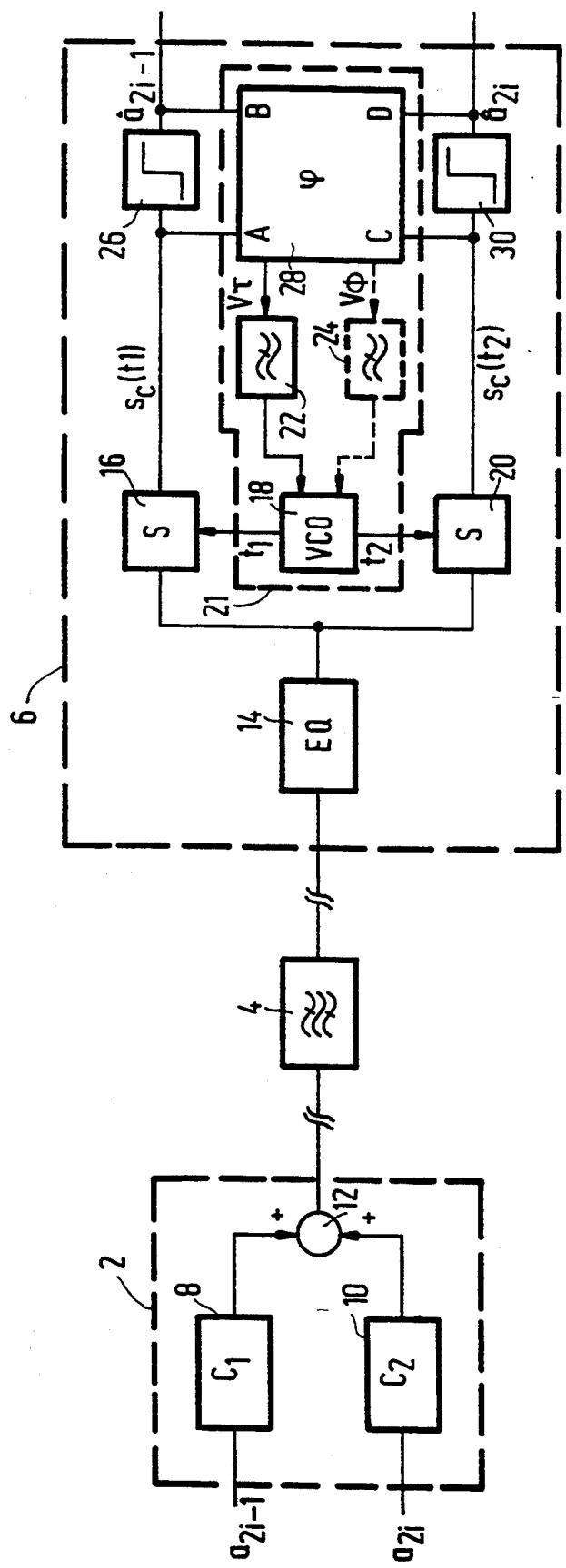
FIG. 1 shows a block diagram of a transmission system according to the invention.

The transmission system shown in FIG. 1 comprises a transmitter 2, a channel 4 and a receiver 6. The coding means are constituted here by a coder 8, a coder 10 and an adder circuit 12. The input of coder 8 is supplied with a first series of data symbols $a_{2i-1}$ and the input of coder 10 is supplied with a second series of data symbols $a_{2i}$ from a continuous sequence of data symbols. The two series may respectively be odd and even data symbols in such sequence. The outputs of the two coders 8 and 10 are connected each to an input of combining means, here an adder circuit 12, for combining the two series of signal elements produced by the coders. The resulting signal at the output of the adder circuit 12 is conveyed to the input of receiver 6 by means of the channel 4.

The input signal of the receiver 6 is applied to the input of an equalizer 14 (adaptive or not). The output of the equalizer 14 is connected to the input of sampling means, in this case two sampling circuits 16 and 20. The output of the sampling circuit 16 (20) is connected to the input of a decision circuit 26 (30). The inputs and outputs of the two decision circuits 26 and 30 are connected to inputs of timing means 21. The timing means comprise means for deriving a timing error signal, in this case constituted by a phase detector 28, and means for adjusting the sampling instants in response to the timing error signal, in this case a low-pass filter 22 and a voltage-controlled oscillator 18. A first output of the phase detector 28, carrying output signal $V\tau$, is connected through the low-pass filter 22 to a frequency control input of the voltage-controlled oscillator 18. The voltage-controlled oscillator has two outputs producing output pulses at the first and the second sampling instants respectively. As already stated, the first sampling instants relate to the first series of data symbols and the second sampling instants relate to the second series of data symbols. Accordingly, these two outputs are connected to the first and the second sampling circuits respectively. The timing means may also comprise, as required, means for adjusting the difference between the first and second sampling instants. For this purpose, the phase detector 28 has an extra output carrying output signal $V\phi$ which is connected through a low-pass filter 24 to a further control input of the voltage-controlled oscillator 18.

Figure 4:
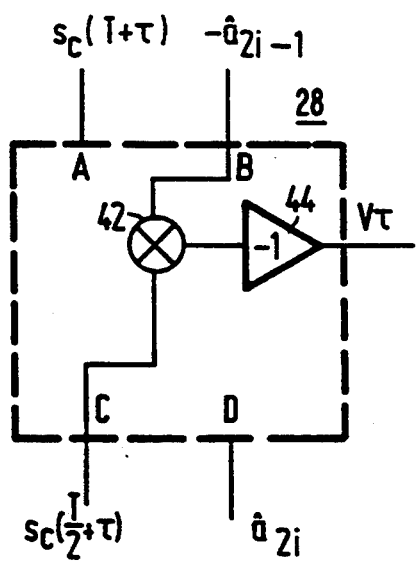
FIG. 4 shows a second embodiment of the phase detector 28 shown in FIG. 1.

The coders 8 and 10 in the transmitter 2 code the applied data symbols $a_{2i-1}$ and $a_{2i}$ respectively, into signal elements to be transmitted over the channel. The relation between the signal elements and the data symbols is determined by the channel code used. One of the possible channel codes that leads to simultaneously transmitted signal elements, and with which the invention may be used, is what is commonly referred to as the Quadra-Phase code known from the aforementioned journal article by Bixby and Ketcham. FIGS.1 and 4 from that journal article show that the Quadra-Phase code is a code by which two signal elements, corresponding to two data symbols, can be transmitted simultaneously as a phase shift of a carrier wave.

FIG. 1 of said article shows a square wave having four possible phases 0, 90°, 180°, 270°, each representing a data symbol made up of two data bits. Thus, each phase transmits a combination of two data bits. FIG. 4 of said article shows a quadra-phase modulator wherein a carrier wave is supplied to each of two multipliers which respectively also receive a first and second data symbol. The multipliers are respectively followed by phase shifters which provided equal but opposite 45° phase shifts, and the outputs of the multipliers are summed to obtain a resultant quadra-phase signal. The phase thereof will represent one of the four possible combinations of the first and second data symbols.

The two series of signal elements generated by the coders 8 and 10 are added together by the adder circuit 12. The combination of the signal elements is transmitted to the receiver over channel 4. The channel will often present a bandpass characteristic. The output signal of the channel 4 is applied to the equalizer 14 for equalizing completely or partly the intersymbol interference caused by the channel 4. The shape of the output signal of equalizer 14 is determined by the transfer function of channel 4 and equalizer 14. Possible embodiments of the equalizer 14 are known from the journal article "Two new equalisation schemes for high-density digital magnetic recording systems with Quadra-Phase modulation code", by J. W. M. Bergmans and S. Mita in Electronics Letters, Jan. 4, 1990, Vol. 26, No. 1, pp. 13–15.

The property of the first signal element adopting a first reference value at a first reference instant and the second signal element adopting a second reference value at a second reference instant, however, remain valid in the output signal of the equalizer. For the Quadra-Phase code the difference between the two reference instants is equal to T/2, where T is the reciprocal of the symbol rate of the symbols $a_{2i-1}$ and of the symbols $a_{2i}$. For the Quadra-Phase code, and also the crank shaft code and the Hedeman codes, it holds, in addition, that one signal element adopts an extreme value when the other signal element adopts the reference value (equal to 0). The latter property simplifies detection of the symbols transmitted by the transmitter. The sampling of the output signal of equalizer 14 by means of sampling circuits 16 and 20 at the first and the second sampling instant respectively, provides two sample values from which decisions $\hat{a}_{2i-1}$ and $\hat{a}_{2i}$ about the values of the respective transmitted symbols $a_{2i-1}$ and $a_{2i}$ can be obtained by means of simple decision circuits 26 and 30 respectively.

The phase detector 28 determines the value of the timing error signal $V\tau$ (and the timing error signal $V\phi$, as required) on the basis of the sample values and the associated decisions about the value of the transmitted symbols. This timing error signal is averaged by means of the low-pass filter 22. The output signal of the low-pass filter 22 is used for adjusting the frequency of the voltage-controlled oscillator in the right direction, so that the sampling instants coincide with the reference instants.

Figure 2:
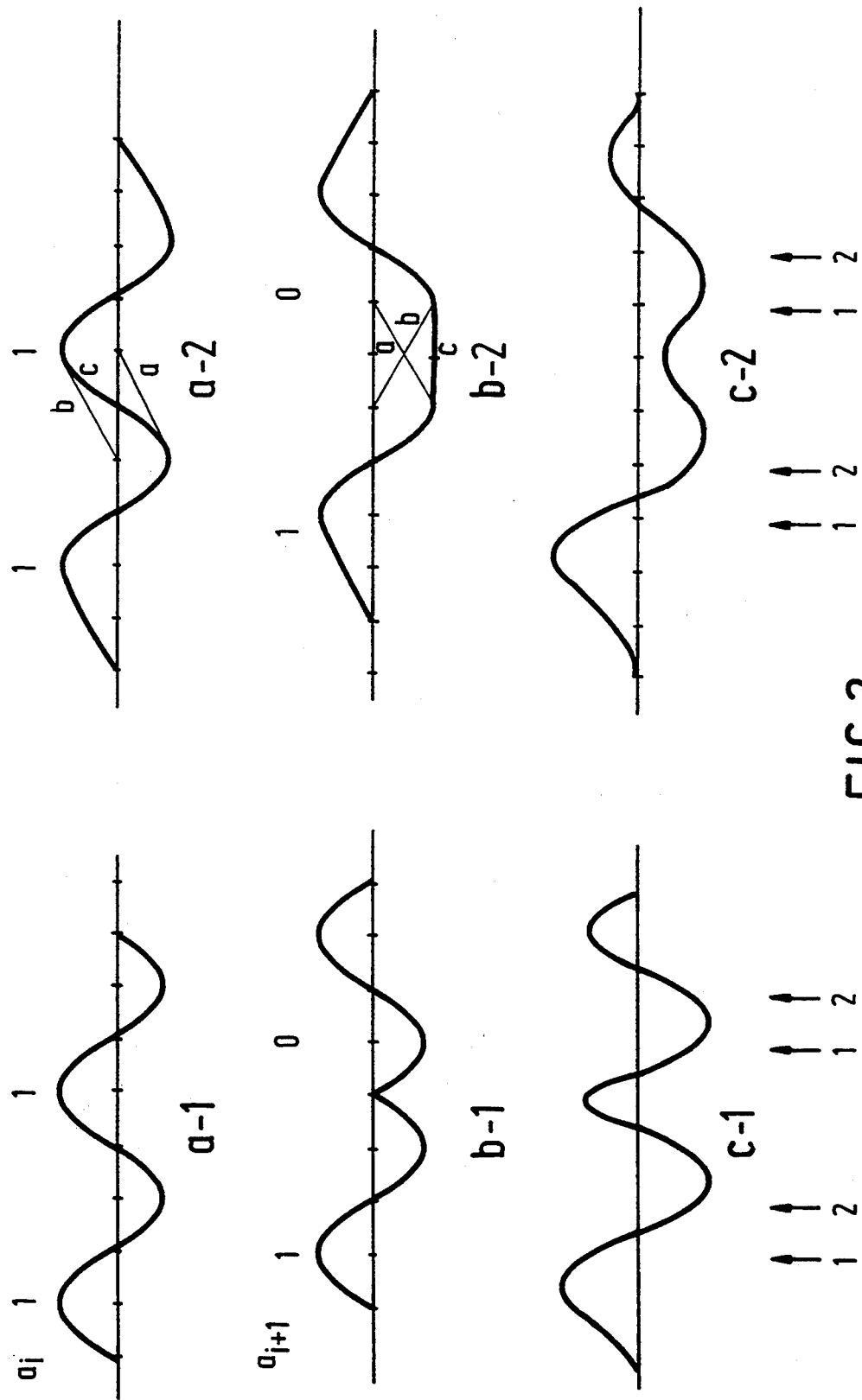
FIG. 2 shows signal variations of the signals which may occur at the input of the sampling circuits 16 and 20 in FIG. 1 as well as the signal elements constituting this signal.

FIGS. 2-a-1 and 2-b-1 show signal elements $a_i$ and $a_i+1$ as they may occur in the Quadra-Phase code at the output of the equalizer. With these signal elements the equalizer 14 is arranged in such a way that substantially all intersymbol interference is removed. As a result, each signal element depends only on the associated symbol and not on the subsequent symbols. FIG. 2-c-1 shows the total output signal of the equalizer 14, i.e. the sum of the two signal elements, with the associated sampling instants 1 and 2.

FIGS. 2-a-2 and 2-b-2 show signal elements which may occur at the output of the equalizer 14 if some intersymbol interference is allowed. These signal elements correspond to the signal elements according to "New scheme 1" in FIG. 3 of aforementioned journal article by Bergmans and Mita. The equalizer is structured in such a way that the intersymbol interference at the reference instants continues to be zero, so that the intersymbol interference does not affect the decisions about the value of the transmitted symbols $a_{2i-1}$ and $a_{2i}$. The advantage of the second equalizing method is that the necessary bandwidth of the channel is considerably smaller than for the first equalizing method. This smaller bandwidth results in a smaller amount of noise at the input of the sampling circuits 16 and 18, so that the bit error rate may be smaller than when the first equalizing method is implemented. The smaller bandwidth is also clearly noticeably shown in the difference between FIG. 2-c-1 and 2-c-2. FIG. 2-c-2 contains distinctly fewer high-frequency components than FIG. 2-C-1.

Figure 3:
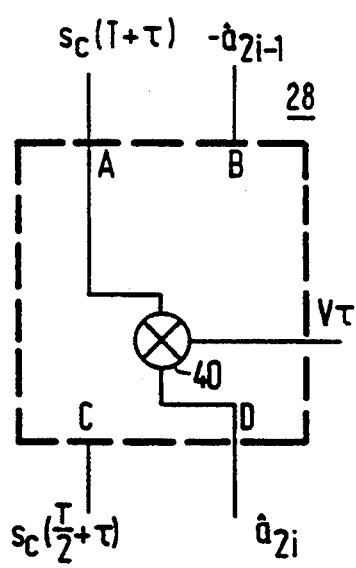
Fig. 3 shows a first embodiment of the phase detector 28 shown in FIG. 1.

In the first embodiment of the phase detector 28 as shown in FIG. 3 the second sample value, in this case the signal $s_c(T+\tau)$, is applied to a first input A of a multiplier circuit 40. To a second input D thereof is applied the expected first sample value, in this case the decision $\hat{a}_{2i}$ provided by decision circuit 30 in FIG. 1. The multiplier circuit 40 determines the correlation therebetween according to the inventive idea. The output of the multiplier circuit 40 then presents a timing error signal $V\tau$ which has an expectation value as shown in formula (5).

In the second embodiment of the phase detector 28 as shown in FIG. 4 the second sample value, in this case the signal $s_c(T+\tau)$, is applied to a first input of a multiplier circuit 42, and the expected second sample value, in this case the decision $\hat{a}_{2i-1}$, is applied to a second input of the multiplier circuit 42. The output of the multiplier circuit 42 then presents a timing error signal $V\tau$ which has an expectation value which is merely sign inverted with respect to the value according to formula (5). The multiplier 42 determines the correlation according to the inventive idea. By inverting the output signal of the multiplier circuit 42 with the aid of an inverter 44, a timing error signal is obtained which is equal to the timing error signal obtained by means of the circuit shown in FIG. 3.

Figure 5:
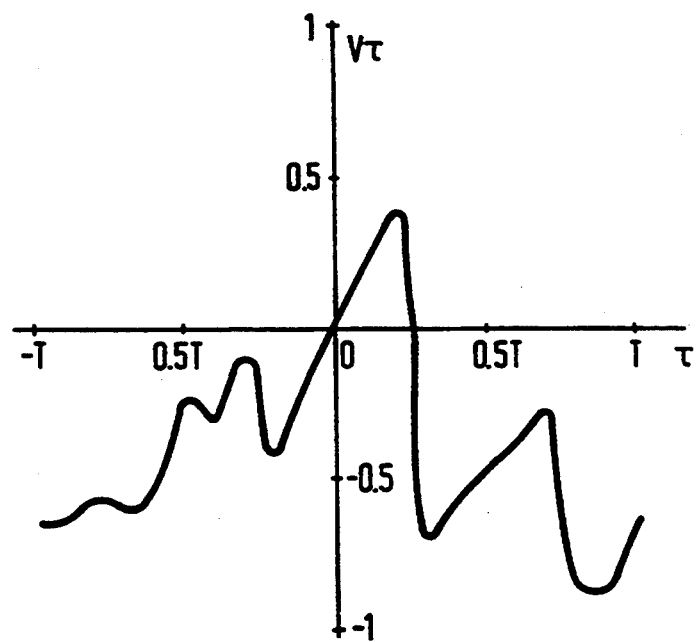
FIG. 5 shows the value of the timing error signal $V\tau$ as a function of $\tau$ when a phase detector as shown in FIG. 3

In the diagram shown in FIG. 5 the value of the timing error signal $V\tau$ is plotted against the timing error $\tau$. This diagram shows that $V\tau$ has no more than one zero with a positive slope for values of $\tau$ situated in an interval $-T \leq \tau \leq T$. This means that the frequency control loop provides that there is only one stable stationary value of $\tau$, viz. zero.

Figure 6:
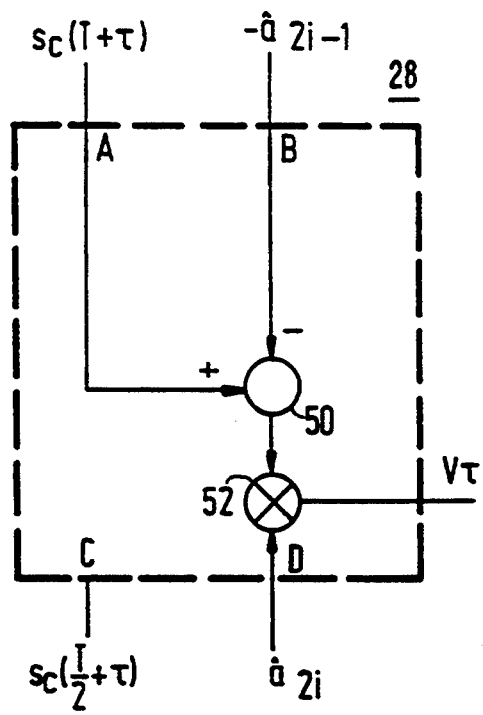
FIG. 6 shows a third embodiment of the phase detector 28 shown in FIG. 1.

In the third embodiment of the phase detector 28 as shown in FIG. 6 the second sample value, in this case the signal $s_c(T+\tau)$, is applied to a positive input of a subtracter circuit 50. The inverted value of the symbol $\hat{a}_{2i-1}$, corresponding to the expected second sample value, is applied to a negative input of the subtracter circuit 50. The output of the subtracter circuit 50 is connected to a first input of a multiplier circuit 52, whilst the expected first sample value, in this case the decision $\hat{a}_{2i}$, is applied to a second input of the multiplier circuit 52. The output of the multiplier circuit 52 then presents the timing error signal $V\tau$.

With the aid of the phase detector as shown in FIG. 6 an error measurement in accordance with formula (6) is obtained. The measure for the expected second sample value is assumed to be equal to the decision $\hat{a}_{2i-1}$ about the value of the symbol $\hat{a}_{2i-1}$. The output signal of the subtracter circuit 50 is then equal to $\hat{a}_{2i-1}-a_{2i-1}\cdot\cos(\pi\tau/T)-a_{2i}\cdot\sin(\pi\tau/T)$. If the decision $\hat{a}_{2i-1}$ is correct, $a_{2i-1}$ is equal to $a_{2i-1}$ and the output signal of the subtracter circuit 50 is equal to $a_{2i-1}-a_{2i-1}\cdot\cos(\pi\tau/T)-a_{2i}\cdot\sin(\pi\tau/T)=2\cdot a_{2i-1}\cdot\sin^2(\pi\tau/2T)-a_{2i}\cdot\sin(\pi\tau/T))$. Finally, the output signal of the multiplier circuit 52 is then equal to $2\cdot a_{2i-1}\cdot a_{2i}\sin^2(\pi\tau/2T)-a_{2i}^2\cdot\sin(\pi\tau/T)$. This timing error signal is equal to the timing error signal according to formula (6).

Figure 7:
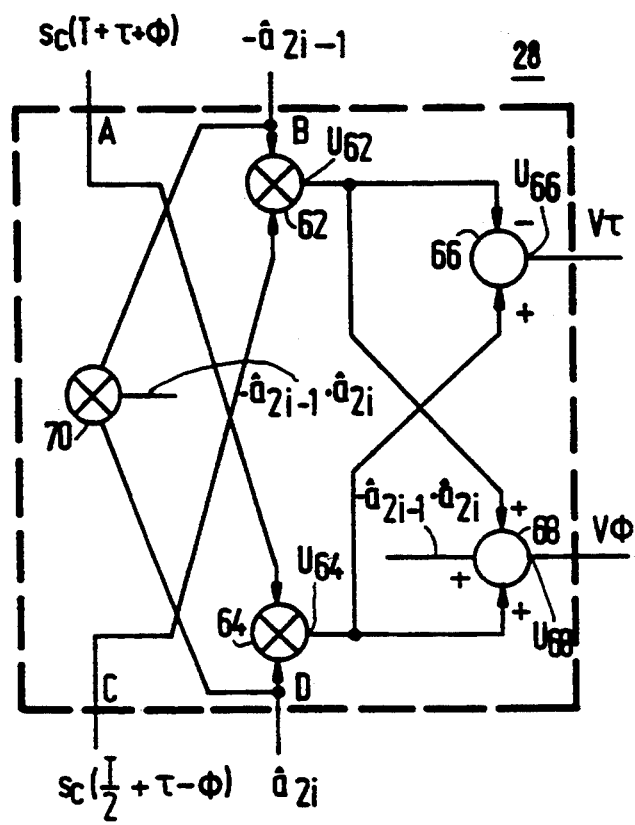
FIG. 7 shows a fourth embodiment of the phase detector 28 shown in FIG. 1.

In the fourth embodiment of the phase detector 18 as shown in FIG. 7 the second sample value, in this case the input a signal $s_c(T+\tau+\phi)$, is applied to a first input of a multiplier circuit 64. The first sample value, in this case the input signal $s_c(T/2+\tau-\phi)$, is applied to a first input C of a multiplier circuit 62.

The expected second sample value, in this case the decision $\hat{a}_{2i-1}$ about the symbol $a_{2i-1}$, is applied to a second input of the multiplier circuit 62. The expected first sample value, in this case the decision $\hat{a}_{2i}$ about the symbol $a_{2i}$ is applied to a second input of the multiplier circuit 64. The output of the multiplier circuit 62 is connected to a negative input of a subtracter circuit 66 and to a first input of an adder circuit 68. The output of the multiplier circuit 64 is connected to a positive input of a subtracter circuit 66 and to a second input of the adder circuit 68. The output of the subtracter circuit 66 presents the timing error signal $V\tau$. A signal which is equal to $\hat{a}_{2i-1}\cdot\hat{a}_{2i}$ is applied to a third input of the adder circuit 68. The output of the adder circuit 68 presents the difference signal $V\phi$.

In the phase detector as shown in FIG. 7 it is assumed that besides a difference between the sampling instants and the reference instants there is also a deviation of the difference between the two sampling instants from the ideal value of this difference. This deviation can be taken into consideration by introducing an error $-\phi$ in the first sampling instant and an error $\phi$ in the second sampling instant. For the two sample values the following values can be derived from formula (1) in the example of the implementation of the Quadra-Phase code:

$$s_c\left(2iT + \frac{T}{2} + \tau - \phi\right) = a_{2i-1} \cdot \cos\left(\frac{\pi}{2} + \pi\frac{\tau - \phi}{T}\right) + a_{2i} \cdot \sin\left(\frac{\pi}{2} + \pi\frac{\tau - \phi}{T}\right) \quad (8)$$

$$= -a_{2i-1} \cdot \sin\left(\pi\frac{\tau - \phi}{T}\right) + a_{2i} \cdot \cos\left(\pi\frac{\tau - \phi}{T}\right)$$

$$s_c(2iT + T + \tau + \phi) = a_{2i-1} \cdot \cos\left(\pi + \pi\frac{\tau + \phi}{T}\right) + a_{2i} \cdot \sin\left(\pi + \pi\frac{\tau + \phi}{T}\right) \quad (9)$$

$$= -a_{2i-1} \cdot \cos\left(\pi\frac{\tau + \phi}{T}\right) - a_{2i} \cdot \sin\left(\pi\frac{\tau + \phi}{T}\right)$$

From (8) it follows for the output signal $U_{62}$ of the multiplier circuit 62:

$$U_{62} = a_{2i-1} \cdot \cos\left(\pi + \pi\frac{\tau + \phi}{T}\right) + a_{2i} \cdot \sin\left(\pi + \pi\frac{\tau + \phi}{T}\right) \quad (10)$$

$$= -a_{2i-1} \cdot \cos\left(\pi\frac{\tau + \phi}{T}\right) - a_{2i} \cdot \sin\left(\pi\frac{\tau + \phi}{T}\right)$$

From (9) it follows for the output signal $U_{64}$ of the multiplier circuit 64:

$$U_{64} = -a_{2i-1} \cdot a_{2i} \cdot \cos\left(\pi \frac{\tau + \phi}{T}\right) - a_{2i}^2 \cdot \sin\left(\pi \frac{\tau + \phi}{T}\right) \quad (11)$$

Assuming that the expectation values of $a_{2i-1}$ and $a_{2i}$ are equal, the following is found for the expectation value $E\{U_{66}\}$ of the output signal of the subtracter circuit 66:

$$E\{U_{66}\} = -2 \cdot E\{a_{2i-1}^2\} \sin\left(\pi \frac{\tau}{T}\right) \cdot \cos\left(\pi \frac{\phi}{T}\right) - \quad (12)$$

$$2 \cdot E\{a_{2i-1} \cdot a_{2i}\} \cdot \sin\left(\pi \frac{\tau}{T}\right) \cdot \sin\left(\pi \frac{\phi}{T}\right)$$

For smaller values of $\tau$ and $\phi$, (12) changes into (5), so that indeed a suitable timing error signal is obtained for frequency adjustment of the voltage-controlled oscillator.

For the expectation value $E\{U_{68}\}$ of the output signal of the adder circuit there may similarly be found:

$$E\{U_{68}\} = -2E\{a_{2i-1}^2\}\cos\left(\pi \frac{\tau}{T}\right) \cdot \sin\left(\pi \frac{\phi}{T}\right) + \quad (13)$$

$$2E\{a_{2i-1}a_{2i}\}\left[1 - \cos\left(\pi \frac{\tau}{T}\right) \cdot \cos\left(\pi \frac{\phi}{T}\right)\right]$$

For small values of $\tau$ and $\phi$ (13) changes into:

$$E\{U_{68}\} = -2 \cdot E\{a_{2i-1}^2\} \cdot \sin\left(\pi \frac{\phi}{T}\right) \quad (14)$$

The signal $U_{68}$ is a measure for the error $\phi$, and may be used for adjusting the difference between the two sampling instants. There may be effected, for example, by means of a phase shifter inserted in one of the output branches of the voltage-controlled oscillator 18.

Other codes that lead to more simultaneously transmitted signal elements and in which the invention may likewise be implemented are, for example, the 'crankshaft code' and the 'Hedeman codes'. The 'crankshaft code' is known from the journal article "Dual digital transmission system for multipair cables based on 'crankshaft coding' by P. I. W. van Gerwen, W. A. M. Snijders and N. A. M. Verhoeckx in Electronics Letters, July 1984, Vol. 20, No. 15. The Hedeman codes are known from the journal article "Further Comments on the Characteristics of the Hedeman H-1, H-2 and H-3 Codes" by R. W. Wood in IEEE Transactions on Communications, Vol. COM-31, No. 1, January 1983, pp. 105–110.

The invention, when subjected to a slight alteration, may also be used for aforementioned 'crankshaft code'. For this purpose, the oscillator 18 in FIG. 1 should provide a time difference between $t_1$ and $t_2$ is equal to T/4, T being the duration of a signal element of the 'crankshaft code'.

Since the Hedeman H2 code is a variant to the quadra-phase code, as appears from aforementioned journal article by Wood, the receiver according to the invention may be used unchanged for the H2 code. The Hedeman H3 code is a code in which three signal elements are transmitted simultaneously. The signal elements now have a duration of 3T.

In the H3 code it is alternatively possible to use the receiver according to the invention unchanged, but in that case a word synchronization mechanism is to be added. The word synchronization mechanism may be omitted if not one but two timing error signals are set at zero. These timing error signals may then be, for example:

$$e_{i1} = \hat{a}_{3i-2} \cdot s_c(3iT + T/2 + \tau) \text{ and } e_{i2} = \hat{a}_{3i-1} s_c(3iT + T + \tau).$$

Simulations have shown that when a phase detector as shown in FIG. 6 is used, convergence of the timing errors $\tau$ and $\phi$ to small values sometimes fails to materialize. This is caused by the initial values of $\tau$ and $\phi$ being so large that the decisions made about the transmitted symbols are erroneous.

Various solutions are possible to avoid this failing of the materialization of convergence.

A first solution is transmitting a known training sequence prior to the useful data. An eminently suitable training sequence is the sequence of symbols +1, +1, −1, −1, +1, +1 etc. In that case in lieu of detected symbols the training sequence symbols already known are used in the receiver for determining the timing errors $\tau$ and $\phi$. Simulations show that when aforementioned training sequence is used, there will always be convergence irrespective of the initial values of $\tau$ and $\phi$.

A second solution to the problem of convergence is obtained by setting the error signal $\phi$ at a fixed value and the output signal of the multiplier circuit 62 at 0 during the convergence phase. This will actually provide the circuit as shown in FIG. 3.

A third solution is deriving a derived timing error signal $V\tau'$ from the timing error signal $V\tau$ with the aid of a hysteresis element during the acquisition phase. Under the influence of the hysteresis element the sampling instants will generally be adjusted in a single direction as a result of which a value of $\tau$ is automatically obtained with time, which value is equal to 0 modulo 2T. Also in this method the value of $\phi$ is to be set at a fixed value.

I claim:

1. A data transmission system comprising a transmitter, a receiver and a transmission channel via which data pulses transmitted by the transmitter are conveyed to and received by the receiver; the transmitter comprising first coding means for encoding a first sequence of data symbols into a series of first signal elements, each first signal element having a signal value which reaches a first reference level at an instant prior to the succeeding first signal element, said instant being a first reference level instant; the transmitter further comprising second coding means for encoding a second sequence of data symbols into a series of second signal elements, each second signal element having a signal value which reaches a second reference level at an instant prior to the succeeding second signal element, said instant being a second reference level instant; the transmitter further comprising means for combining said first and second series of signal elements to form a sequence of data pulses for transmission via said transmission channel to said receiver; each data pulse being a combination of a first signal element and a second signal element and having a signal value which at each of said first reference level instants corresponds to the signal value of the succeeding second signal element, and at each of said second reference level instants corresponds to the signal value of the preceding first signal element; characterized in that said receiver comprises:

first sampling means for sampling the received sequence of data pulses at a series of first sampling instants to derive a series of first sample values of said sequence, and first decision circuit means coupled to said first sampling means for deriving from said first sample values decision values of a series of first data symbols corresponding to said series of first sample values;

second sampling means for sampling the received series of data pulses at a series of second sampling instants to derive a series of second sample values of said sequence, and second decision circuit means coupled to said second sampling means for deriving from said second sample values decision values of a series of second data symbols corresponding to said series of second sample values;

said first and second sampling instants being related so that the decision values of said series of first data symbols constitute expected values of said series of second sample values, and the decision values of said series of second data symbols constitute expected values of said series of first sample values; and timing means coupled to said first and second decision circuits for producing a timing error signal based on at least one correlation between said first sample values, said second sample values and; said expected values of said series of first and second sample values; said timing means being further coupled to said first and second sampling circuits to supply said timing signal thereto for controlling said first and second sampling instants so as to correlate with said first and second reference level instants of said signal elements.

2. A data transmission system as claimed in claim 1, wherein said timing means produces said timing error signal based on a correlation between (i) the expected values of said series of first sample values and (ii) the difference between said series of second sample values and said expected values of said series of second sample values.

3. A data transmission system as claimed in claim 1, wherein said timing means produces said timing error signal based on the difference between (i) a correlation between said series of second sample values and said expected values of said series of first sample values, and (ii) a correlation between said series of first sample values and said expected values of said series of second sample values.

4. A data transmission system as claimed in claim 1, wherein each of said second signal elements is a scaled phase lagging version of a first signal element.

5. A data transmission system as claimed in claim 1, wherein said timing error signal controls the time between each of said first sampling instants and the succeeding second sampling instants, and said timing error signal is proportional to the difference between (i) the sum of a correlation between said series of second sample values and said expected values of said series of first sample values, and a correlation between said series of first sample values and said expected values of said series of second sample values, and (ii) a value proportional to a correlation between expected values of said series of first sample values and expected values of said series of second sample values.

6. A data transmission system as claimed in claim 1 wherein said transmitter comprises means for transmitting a training sequence of successive groups of data symbols of known values, the signal elements corresponding to consecutive groups of said data symbols being of opposite sign, and said receiver comprises means for obtaining said expected values of said series of first and second sample values from the known values of the data symbols of said training sequence.

7. A data transmission system as claimed in claim 1, wherein after said timing error signal has resulted in acquisition of sampling instants approximately corresponding to said reference level instants, said timing means derive a modified timing error signal based on (i) a correlation between the values of said series of second sample values and said expected values of said series of first sample values, and (ii) a correlation between the values of said series of first sample values and said expected values of said series of second sample values.

8. A data transmission system as claimed in claim 1, wherein each pair of said first and second successive signal elements constitute a combined signal element of a quadra-phase code.

* * * * *